United States Patent [19]

Fernsler et al.

[11] Patent Number: 5,034,664
[45] Date of Patent: Jul. 23, 1991

[54] PARABOLA GENERATORS WITH AUXILIARY RESET FUNCTION

[75] Inventors: Ronald E. Fernsler; Enrique Rodriguez-Cavazos; Nancy D. Graves, all of Indianapolis, Ind.

[73] Assignee: Thomson Consumer Electronics, Inc., Indianapolis, Ind.

[21] Appl. No.: 515,972

[22] Filed: Apr. 27, 1990

[51] Int. Cl.[5] ............................................. H01J 29/56
[52] U.S. Cl. ................................. 315/370; 315/403; 315/371; 307/490
[58] Field of Search ............... 315/371, 370, 403, 368; 307/490

[56] References Cited

U.S. PATENT DOCUMENTS

| | | | |
|---|---|---|---|
| 3,697,778 | 10/1972 | Olson | 307/490 |
| 4,216,392 | 8/1980 | Valkestijn | 307/268 |
| 4,777,411 | 10/1988 | O'Connor et al. | 315/371 |

Primary Examiner—Theodore M. Blum
Attorney, Agent, or Firm—Joseph S. Tripoli; Joseph J. Laks; Harvey D. Fried

[57] ABSTRACT

A parabola generator for geometric correction of a television raster, comprises: a resettable circuit for generating a repetitive ramp signal and a resettable integrator for generating a repetitive parabola signal from said repetitive ramp signal. A first resetting circuit initializes the ramp circuit at a frequency related to a scanning frequency. An auxiliary resetting circuit initializes the integrator prior to integrating each repetitive ramp. The auxiliary resetting circuit minimizes timing errors from variations of the ramp signal due to transient conditions. In one embodiment, the scanning period is a horizontal scanning period and the ramp and parabola circuits are reset at the end of each horizontal scanning interval. In this case, the first and auxiliary resetting circuits are responsive to horizontal retrace pulses, for example the leading edges of the horizontal retrace pulses. A further circuit modulates the periodically reset parabolic signal at a vertical scanning rate. In another embodiment, the scanning period is a vertical scanning period and the ramp and parabola circuits are reset at the end of each vertical scanning interval. In this case, the first and auxiliary resetting circuits are responsive to vertical retrace pulses, for example the leading edges of the vertical retrace pulses. A further circuit modulates the periodically reset parabolic signal at a horizontal scanning rate. The parabolic waveform is also reset responsive to a timing signal, rather than by allowing the mimimum level of the waveform to be defined only by uncontrolled operation of an integrator.

28 Claims, 3 Drawing Sheets

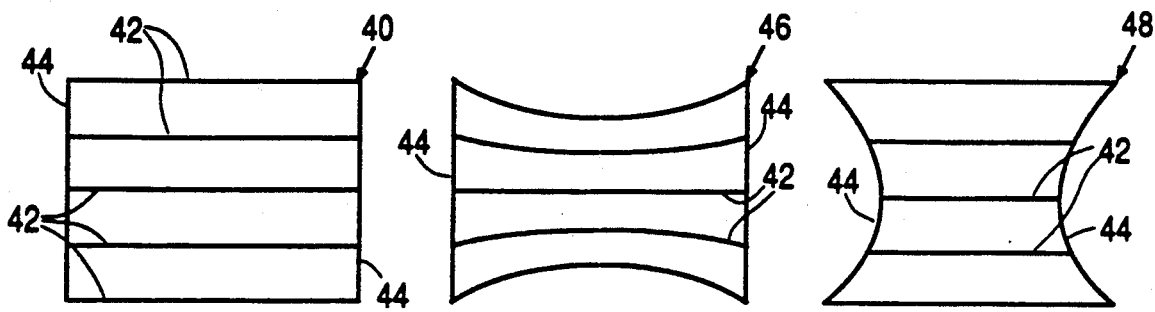
FIG. 1  FIG. 2  FIG. 3
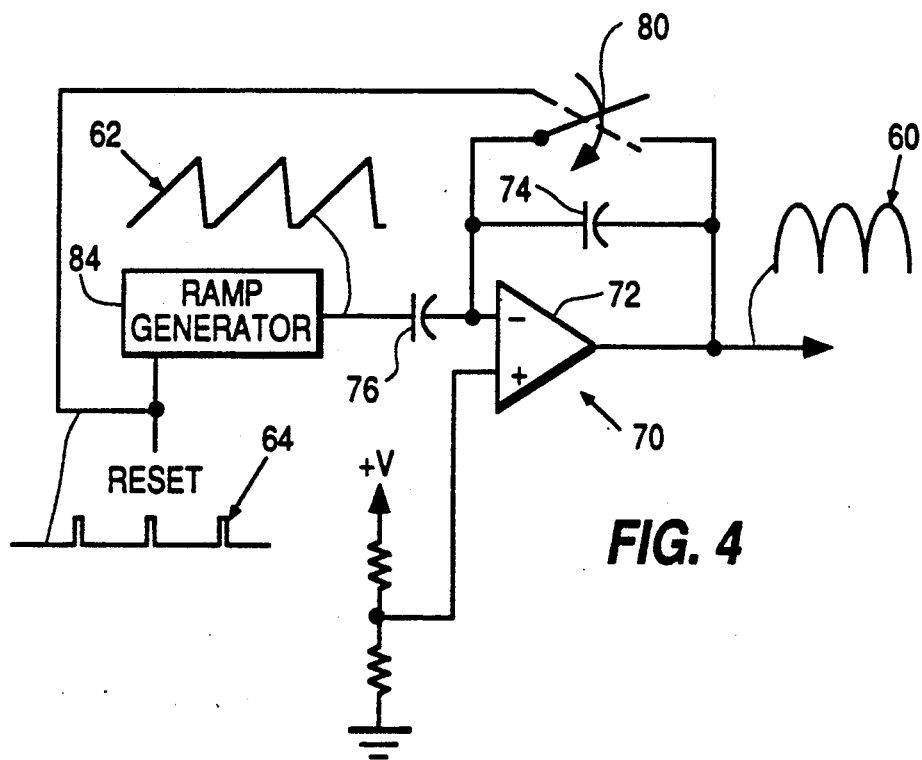
FIG. 4
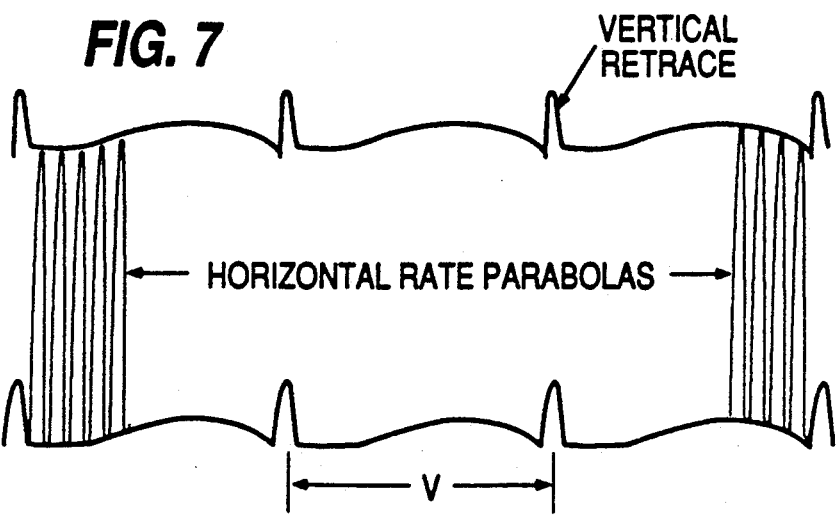
FIG. 7

PARABOLA GENERATORS WITH AUXILIARY RESET FUNCTION

This invention relates to the field of parabola generating circuits for use in correcting distortion of raster displays in televisions, and in particular, to parabolic waveform generators which exhibit enhanced immunity to vertical rate disturbances as may be caused by operation of certain kinds of vertical deflection circuits and enhanced immunity to distortion during channel change.

A theoretically correct scanned raster display in a television apparatus is exactly rectilinear, with all the horizontal lines of the raster straight and parallel. In unidirectional raster scanning, of course, the scan lines have a very slight downward inclination. Several different kinds of distortion can result from either the circuits producing the vertical or horizontal beam deflection signals, or from the geometry of a projection television system. Pincushion distortion is characterized by an inward bowing of the raster. Pincushion distortion can be a problem in both direct view and projection sets. Trapezoidal distortion is mainly a problem of projection sets because all of the multiple projection tubes cannot be aligned on the same projection axis. Convergence distortion is characterized by a misregistration of corresponding points of the respective rasters produced by the projection tubes of a projection set.

One form of pincushion distortion is often referred to as North-South pincushion distortion. The horizontal raster lines at the top and bottom of the display are bowed inwardly toward the center of the display by an amount which is greatest for lines at the extreme top and bottom, and less approaching the vertical center. Another form of pinchushion distortion is referred to as East-West or side pinchushion distortion, and is characterized by the endpoints of the horizontal raster lines varying in lateral position such that the width of the horizontal raster lines is less at the vertical center of the raster than at the top and bottom.

In a projection television apparatus, a color display can be produced by projecting three separate rasters from monochrome cathode ray tubes (CRTs) for the primary colors from different locations, and overlaying the three rasters when projecting them onto a viewing screen. Pincushion, trapezoid and convergence distortion must be corrected individually for the raster of each projection tube. Pincushion correction is often not corrected by modifying the main deflection signals driving the main horizontal and vertical deflection yokes, as in many direct view sets, due to undesirable spot degradation. Projection tubes can be provide with auxiliary horizontal and vertical deflection yokes for correcting geometrical distortions, such as pincushion and trapezoid, as well as convergence. The correction signals for each kind of distortion can be combined into composite correction signals for driving the auxiliary yokes. Accordingly, disturbances in any one of the correction signals can disturb correction of the other distortion as well.

A North-South pincushion correction signal can be obtained by integrating ramps at the horizontal rate to generate parabolas and modulating the resulting parabolas at the vertical rate. This correction signal is a maximum amplitude parabola for lines at the top of the raster, no correction at the center of the raster, and a maximum amplitude parabola of an opposite polarity at the bottom. A side pincushion correction signal can be obtained by integrating ramps at the vertical rate to generate parabolas and modulating the parabolas at the horizontal rate. This correction signal is a parabola of maximum amplitude at the vertical center of the raster, and opposite polarities for the lateral sides of each scan line. Horizontal and vertical retrace, or flyback, pulses can be use for timing the horizontal and vertical rate signals, respectively, if the pulse widths and frequencies (and consequently the respective periods) of the retrace pulses are substantially constant. Variations in the pulse widths and/or frequencies of the retrace pulses can disturb the generation of accurate correction parabolas, particularly those used in North-South pincushion correction.

The circuits for generating the horizontal and vertical rate parabolas for correcting raster distortion can be coupled to the same horizontal and vertical deflection circuits that produce the deflection signals applied to the primary deflection yokes of the respective CRTs of a projection television, for example through the high voltage transformer, in order to synchronize the correction circuits with the main deflection systems. The transformer can be a source of horizontal and vertical retrace pulses. However, operation of the vertical deflection circuit can cause certain problems in the retrace signals due to loading of the deflection circuits.

Under ideal circumstances, the width of the horizontal retrace pulses and the frequency (and consequently the period) of the horizontal retrace pulses is constant. However, certain disturbances, characterized as phase distortion or timing distortion, or both, resulting from operation of the vertical deflection circuit can alter the constancy of the width and frequency of the horizontal retrace pulses. Timing disturbances at a vertical rate can be coupled through the secondary windings of the integrated high voltage transformer. The timing disturbances can modulate the horizontal retrace pulses, by altering pulse width or frequency, or both. The horizontal retrace pulses are used to reset the ramp generating portion of the parabola generator at the horizontal rate. The modulation is at the vertical rate and multiples thereof. In many vertical deflection systems the phase or timing distortions are small enough to be tolerable. Special compensation circuits are not usually required.

Some vertical deflection systems, for example switched mode vertical deflection systems, can produce significant phase distortion in all the secondary windings of the integrated high voltage transformer due to the switched mode of operation. The phase distortion can be most pronounced during the last part of vertical retrace, when the current through the switched elements, for example an SCR for effecting switched vertical retrace, is at its peak. The loading from this current modulates the horizontal retrace pulses, causing variation of pulse width or variation of frequency, or both, even from line to line. Changes in either pulse width or frequency (and consequently period) are processed in a way which causes variation of horizontal rate signals produced in signal generators relying on horizontal retrace pulses for timing, for example those in parabola generators. The ramp signal in a parabola generator, for example, will not have a constant frequency, and the ramps will have different maximum amplitudes. Horizontal rate ramp signals can be integrated to produce a horizontal rate parabola for North-South pincushion correction, or used as a modulation signal for side pincushion correction. Variations in the start time of the ramps, the duration of the ramps and the maximum amplitude of the ramps will have a detrimental effect on the parabolas or modulated signal envelopes. As a result of the variations in the horizontal retrace pulses, the horizontal rate parabola signal and/or modulation signal can vary in amplitude at the vertical rate.

Typically, the ramp signal developed in a parabola generator, for example, is AC coupled to an integrator. The capcacitor which effects the AC coupling must have a long enough time constant to avoid distortion of the ramp signal prior to integraion. The long time constant will permit the vertical rate disturbance, for example at 60 Hz and multiples thereof, to couple through the capacitor as well. The peak-to-peak voltage will vary and the average voltage will vary. Changes in the average voltage will be processed by the integrator as a DC voltage offset, positive or negative depending on the variation. Several vertical periods are necessary for the error resulting from the change in average voltage to disappear, due to the long time constant of the integrator. If a single variation is of sufficient magnitude, the parabolas will have different amplitudes for several vertical periods, until the average voltage returns to zero. Lack of precision in convergence correction may be noticeable briefly, but the problem is tolerable if not easily perceptible, intermittent and self correcting. However, if the variations persist, as can happen in a system having a switched mode vertical deflection circuit, the errors of each successive horizontal line will accumulate in the integrator. As a result, the parabola will become progressively distorted, perhaps even reaching the point of causing further distortion of the raster instesd of correcting the raster. In some cases, the amplitude envelope of the repetitive parabolas can exhibit a nonlinear vertical rate distortion due to the accumulated errors, as shown for example in FIG. 7. The distortion can be particularly acute during vertical retrace. The problem can be overcome according to an aspect of the invention by also resetting the integrator at the horizontal rate, for example by the same horizontal rate retrace pulses used to reset the horizontal rate ramp generator. This assures that no errors can accumulate in the integrator, from one horizontal line to the next.

Another problem having a similar detrimental result on correction waveforms can occur during a channel change, when the vertical deflection circuit must lock to the synchronizing signals of a new video signal. Locking onto a new video signal can not be accomplished instantaneously, but requires a certain time interval. The loss of vertical synchronizing pulses during channel change will conseqently result in the loss of vertical reset pulses and vertical retrace pulses. In order to prevent the raster from collapsing, most vertical deflection circuits provide for a free running mode at a slightly slower frequency than the vertical rate. This may be accomplished by an analog oscillator or a digital vertical countdown circuit. A vertical countdown circuit, for example in an NTSC interlaced scanning television operating at a vertical rate of 60 Hz, may be adapted to produce reset pulses at an expected vertical frequency based on a $2f_H f_V$ ratio of 592:1, that is a vertical frequency of 53 Hz. When changing channels, the vertical deflection ramp charges longer than normal until a valid sync signal from the new video signal is detected, because the vertical period is effetively increased by the lower free running or countdown frequency. The effect of the extended charging of the vertical ramp is that the average value of the ramp signal AC coupled to the integrator will increase considerably, so that the shape and size of the parabolas generated after restoration of vertical sync will reflect a substantial DC offset voltage. The offset voltage can require several vertical fields to return to a zero average value. During this time, the pincushion correction circuits can deviate substantially from their steady state levels. The resulting error, in a projection television, having superimposed rasters and composite correction waveforms driving the auxiliary deflection coils, is referred to as convergence bounce following a channel change. The problem can be overcome according to another aspect of the invention by also resetting the integrator at the vertical rate, for example by the same vertical retrace pulses used to rest the vertical rate ramp generator. This assures that the integrator will begin each vertical trace with no DC offset voltage.

It is an aspect of the invention to provide parabola generating circuits which are not prone to transient and vertical rate errors.

It is a further aspect of the invention to isolate convergence and pincushion distortion correction circuits from the effects of loading of the high voltage transformer during vertical retrace, for example of the kind resulting from switched mode operation of the vertical deflection circuit.

It is another aspect of the invention to permit pincushion correction circuits to recover from a loss of vertical sync in a minimum time, without apparent effects on the accuracy of convergence correction due to channel changes and comparable transient effects.

In accordance with these and other aspects of the invention, a parabola generator for geometric correction of a television raster, comprises: a resettable circuit for generating a repetitive ramp signal and a resettable integrator for generating a repetitive parabola signal from said repetitive ramp signal. A first resetting circuit for initializes the ramp circuit at a frequency related to a scanning frequency. An auxiliary resetting circuit for initializes the integrator prior to integrating each repetitive ramp. The auxiliary resetting circuit minimizes timing errors from variations of the ramp signal due to transient conditions. In one embodiment, the scanning period is a horizontal scanning period and the ramp and parabola circuits are reset at the end of each horizontal scanning interval. In this case, the first and auxiliary resetting circuits are responsive to horizontal retrace pulses, for example the leading edges of the horizontal retrace pulses. A further circuit modulates the periodically reset parabolic signal at a vertical scanning rate for driving an electron scanning beam deflection circuit, for example one having an auxiliary deflection coil. In another embodiment, the scanning period is a vertical scanning period and the ramp and parabola circuits are reset at the end of each vertical scanning interval. In this case, the first and auxiliary resetting circuits are responsive to vertical retrace pulses, for example the leading edges of the vertical retrace pulses. A further circuit modulates the periodically reset parabolic signal at a horizontal scanning rate for driving an electron scanning beam deflection circuit, for example one having an auxiliary deflection coil.

More particularly, the parabola circuit may comprise an integrator for integrating a repetitive ramp signal, the integrator generating a waveform which is set to a zero value amplitude by operation of the auxiliary resetting circuit. The integrator may comprise an operational amplifier and an integrating capacitor. The auxiliary resetting circuit may comprise a transistor switch for discharging the capacitor. The integrator may be coupled to a high voltage transformer operable to power deflection of a beam of the raster, the resetting circuit correcting errors in the raster coupled through the tranformer.

Resetting the waveform responsive to a timing signal rather than allowing the minimum level of the waveform to be defined only by operation of the integrator, that is by the uncontrolled dissipation of the charge on the capacitor, improves the accuracy of pincushion correction.

FIG. 1 is a diagram illustrating a rectilinear raster.

FIG. 2 is a diagram illustrating North-South pincushion distortion of a raster.

FIG. 3 is a diagram illustrating East-West pincushion distortion.

FIG. 4 is a block diagram of a circuit for generating a a parabolic correction signal according to an aspect of the invention.

FIG. 7 is a diagram illustrating nonlinear vertical rate distortion.

Figure 5:
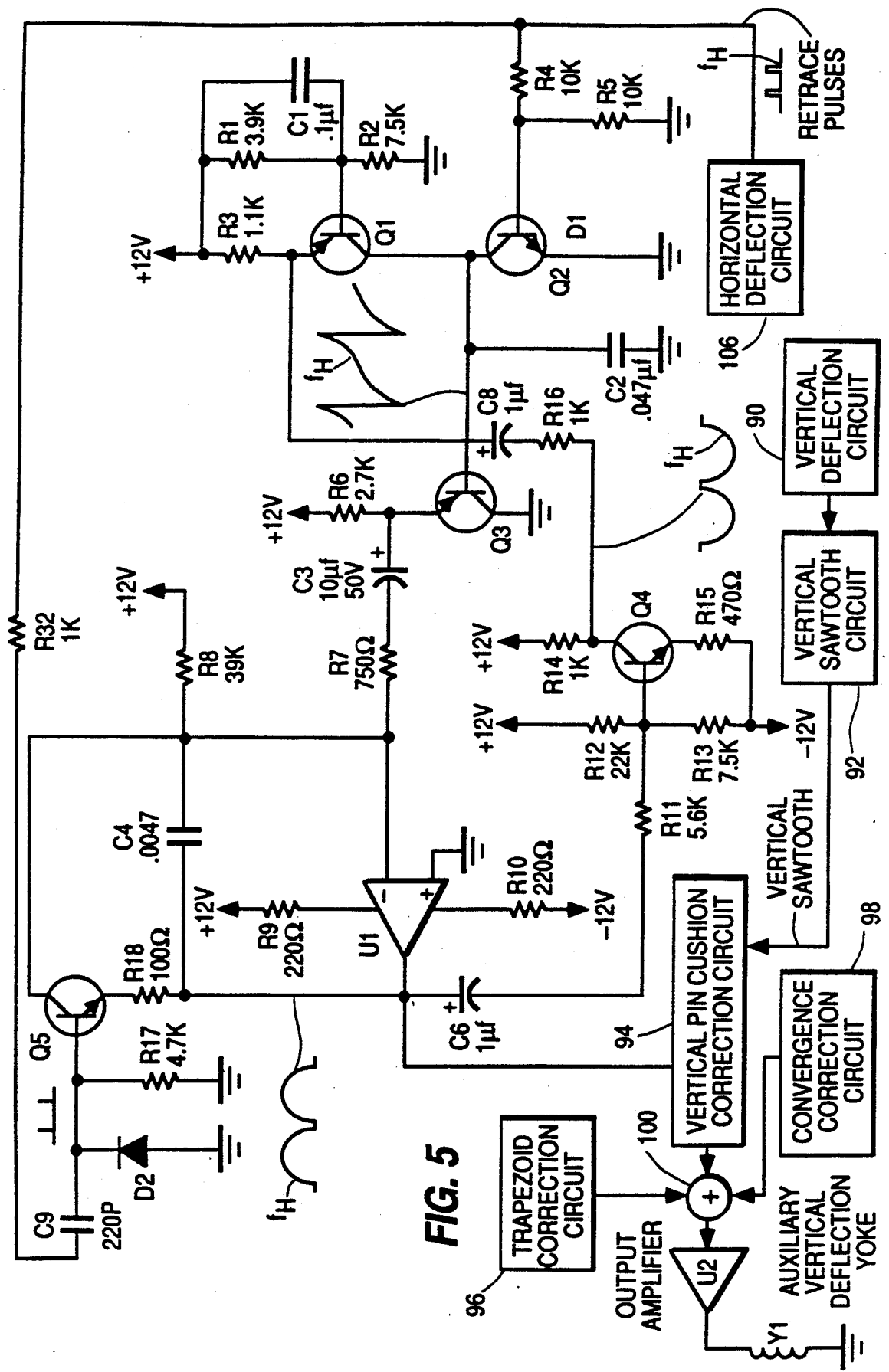
FIG. 5 is a circuit schematic of a parabola generator for developing a correction signal for North-South pincushion correction, according to an aspect of the invention.

The raster 40 shown in FIG. 1 is an accurate and correct video display formed from a plurality of straight horizontal scan lines 42, which are of equal length and are parallel. The endpoints 44 of the scan lines all reside along vertical lines at the lateral sides of the raster display, perpendicular to the individual scan lines 42. Distortion of the raster can be produced due to distortions produced in the deflection circuits, in the curvature of the viewing surface or in the geometry of a projection system. Two examples of distortion in direct view and projection sets are the North-South (or top-bottom) pincushion distortion shown in FIG. 2, and the East-West (side) pincushion distortion shown in FIG. 3. Trapezoid and convergence distortion are not illustrated, but can also be expected in a projection set.

In the North-South pincushion distortion of raster 46, the individual scan lines 42 of the raster display bow inwardly by an amount which is greatest at the top and bottom of the raster, and is less approaching the vertical center. The vertical deflection of the scanning electron beam can be adjusted by means of a parabolic shaped correction signal at the frequency of horizontal scanning to correct this distortion. The parabolic correction signal is modulated by a ramp at the vertical rate such that the correction parabola has a maximum positive (upward) amplitude at the top line of the raster, a zero amplitude at the vertical center scan line (which is not distorted), and a maximum negative (downward) amplitude at the bottom scan line.

In the East-West pincushion distortion of raster 48, the scan lines 42 at the top and bottom of the raster are longer than those at the vertical center, producing an inward bowing of the lines 44 at the sides of the raster, corresponding to the endpoints of the respective scan lines. This distortion can also be corrected by a parabolic correction signal, applied to modify horizontal deflection of the scanning beam. In this case, however, the parabola is at the vertical rate and the modulation is by a ramp at the horizontal rate.

In a projection television apparatus, the distorton of the rasters of the thee primary color CRTs may be different due to differences in scanning deflection and differences in projection angles between the projection axes and the axial center (the center of curvature) of the projection surface or screen. When corresponding points of the three rasters as projected over one another do not precisely coincide, a convergence error occurs.

FIG. 4 illustrates in block form a circuit for producing a parabolic correction signal according to an aspect of the invention. The sawtooth shaped output signal 62 of a periodically reset ramp generator 84 is AC coupled to an active integrator 70 via a series capacitor 76. The integrator 70 comprises an operational amplifier 72 and a feedback capacitor 74, and produces the parabolic output 60 as shown.

The ramp generator 84 can comprise a constant current supply for charging a capacitor, producing an ascending ramp voltage, and means such as a transistor for quickly discharging the capacitor to cause the voltage to drop off at the conclusion of the vertical or horizontal interval. Integration of the AC coupled ramp signal produces a repetitive parabola signal, useful for correction of pincushion distortion. However, the parabola signal produced by the integrator 70 is subject to variation due to periodic and/or transient variations which occur in the ramp signal 62. These periodic or transient variations can result, for example, from vertical rate disturbances coupled from the vertical deflection system and from loss of vertical sync during channel change. In either case, the timing disturbances are coupled through capacitor 76, which has a long time constant to prevent distortion of the ramp signal. The timing errors change the average voltage level at the input to the integrator 70. The difference in average voltage level is processed by the integrator as a DC offset, which distorts the steady state shape of the parabolas. In view of the long time constant of the integrator, the average voltage error will require several vertical periods to dissipate. If the timing disturbance is periodic and repetitive, the average voltage level error in the integrator will not have an opportunity to dissipate. Instead, the error will accumulate, increasing the distortion of the parabola. According to an aspect of the invention, the capacitor 74 forming the feedback path of the operational amplifier 72 of integrator 70 is coupled to a switch means 80 operative to discharge the capacitor 74 during the occurrence of reset pulse 64. This periodic initialization prevents any accumulaiton of error, and assures that each parabola generated will start with a zero average voltage level, that is, with no unintended DC offset. Such a circuit in accordance with aspects of the invention is substantially insensitive to variations in the ramp signal 62.

Different forms of periodic and/or transient variations can affect the generation of the ramp signal and therefore the parabola. Certain disturbances, for example, characterized as phase distortion or timing distortion, or both, resulting from operation of the vertical deflection circuit can alter the constancy of the width and frequency of the horizontal retrace pulses. Timing disturbances at a vertical rate and multiples thereof can be coupled through the secondary windings of the integrated high voltage transformer. The iming disturbances can modulate the horizontal retrace pulses, by altering pulse width or frequency, or both. The horizontal retrace pulses are used to reset the ramp generating portion of the parabola generator at the horizontal rate. Some vertical deflection systems, for example switched mode vertical deflection systems, can produce significant phase distortion in all the secondary windings of the integrated high voltage transformer due to the switched mode of operation. The phase distortion can be most pronounced during the last part of vertical retrace, when the current through the switched elements, for example an SCR for effecting switch vertical retrace, is at its peak. The loading from this current modulates the horizontal retrace pulses, causing variation of pulse width or variation of frequency, or both, even from line to line. As a result, the ramp signal in a parabola generator, for example, will not have a constant frequency, and the ramps will have different maximum amplitudes. Horizontal rate ramp signals can be integrated to produce a horizontal rate parabola for North-South pincushion correction, or used as a modulation signal for side pincushion correction. Variations in the start time of the ramps, the duration of the ramps and the maximum amplitude of the ramps will have a detrimental effect on the parabolas or modulated signal envelopes. As a result of the variations in the horizontal retrace pulses, the horizontal rate parabola signal and-/or modulation signal can vary in amplitude at the vertical rate.

Another problem having a similar detrimental result on correction waveforms can occur during a channel change, when the vertical deflection circuit must lock to the synchronizing signals of a new video signal. Locking onto a new video signal can not be accomplished instantaneously, but requires a certain time interval. The loss of vertical synchronizing pulses during channel change will consequently result in the loss of vertical reset pulses and vertical retrace pulses. In order to prevent the raster from collapsing, most vertical deflection circuits provide for a free running mode at a slightly slower frequency than the vertical rate. When chaning channels, the vertical deflection ramp charges longer than normal until a valid sync signal from the new video signal is detected, because the vertical period is effectively increased by the lower free running frequency. The effect of the extended charging of the vertical ramp is that the average value of the ramp signal AC coupled to the integrator will increase considerably, so that the shape and size of the parabolas generated after restoration of vertical sync will reflect a substantial DC offset voltage. The offset voltage can require several vertical fields to return to a zero average value. During this time, the pincushion correction circuits can deviate substantially from their steady state levels. The resulting error, in a projection television having superimposed rasters and composite correction waveforms driving the auxiliary deflection coils, is referred to as convergence bounce following a channel change. The problem can be overcome according to another aspect of the invention by also resetting the integrator at the vertical rate, for example by the same vertical retrace pulses used to reset the vertical rate ramp generator. This assures that the integrator will be initialized after each vertical trace so as to begin each successive vertical trace with no DC offset voltage.

In each of the foregoing examples, the integrator of a parabola generator, as well as the ramp circuit, are reset by the reset pulse. The auxiliary reset function of the parabola signal dependably initializes, that is zeroes, the integrator before the beginning of each repetitive parabola. This eliminates undesirable periodic variation of the parabola signal from timing disturbances originating in vertical deflection systems and prevents distortion of the parabolas following restoration of vertical sync, for example after channel change. In prior art systems, each repetitive parabola begins from whatever residual DC offset is processed by the integrator, as a result of a distorted ramp signal. Such circuits are subject to considerable distortion, particularly during channel change when vertical sync is temporarily lost and particularly when used in conjunction with noisy vertical deflection systems, such as those operating in a switched mode. According to an aspect of the invention, each repetitive parabola is always initialized from a predefined level, for example a zero DC offset, due to an auxiliary reset function responsive to a timing signal.

FIG. 5 illustrates a circuit schematic for implementing a correction circuit for North-South pincushion distortion, according to an aspect of the invention. The circuit comprises a ramp generator having a current source in the form of PNP transistor Q1, whose collector is coupled to integrating capacitor C2. Current source transistor Q1 charges capacitor C2 to form the ramp or sawtooth signal at the horizontal scanning rate. The emitter of Q2 is coupled to the positive supply through resistor R3. The level at the base of Q1 is fixed by a voltage divider comprising resistors R1 and R2. A capacitor C1 decouples the voltage divider junction (and the base of Q2) relative to the positive supply. Subject to feedback to the emitter of Q1 via R16 and C8 as discussed hereinafter, the current supplied by current source Q1 is substantially constant, whereby integrating capacitor C2 charges constantly to obtain a ramp.

Integrating capacitor C2 is discharged by switching transistor Q2 during the horizontal retrace. Resistors R4 and R5 couple the base of transistor Q2 to a reset signal from the horizontal deflection circuit 106, for example to the secondary winding of the IHVT that produces retrace pulses. Diode D1 clamps the base of Q2 with respect to ground. During a retrace pulse, capacitor C2 is discharged and upon completion of the retrace pulse C2 begins to charge again, the signal at C2 therefore defining a sawtooth at the horizontal rate.

The sawtooth is coupled to a follower amplifier stage formed by PNP transistor Q3, whose emitter is coupled to the positive supply through resistor R6, and reproduces the sawtooth. The sawtooth is AC coupled through series capacitor C3 and resistor R7 to an active integrator. The integrator comprises operational amplifier U1, to which the ramp signal is coupled at the inverting input. Feedback capacitor C4 is coupled between the output of the operational amplifier and the inverting input. Resistors R9 and R10 are coupled to the positive and negative 12V power supplies, respectively. By integrating the AC coupled horizontal rate ramp signal, a parabola 60 at the horizontal rate is obtained at the output of operational amplifier U1. A vertical deflection circuit 90 provides an output to a vertical sawtooth circuit 92, which in turn generates a vertical sawtooth signal as an input for a North-South pincushion correction circuit 94. The vertical deflection circuit can be a switched mode vertical deflection circuit. Switched mode vertical deflection circuits are known in the art and need not be described herein in detail. Mention can be made that switched mode vertical deflection circuits comprise active switching elements, for example SCRs. The switching elements can conduct large scanning currents, particularly near and during vertical retrace. The switching elements can be a source of considerable noise, at vertical scanning rates and multiples thereof, which can easily couple to other circuits, for example through the high voltage or flyback transformer. The North-South pincushion correction circuit modulates the parabola by the vertical sawtooth signal, at the vertical rate, in a known manner. The modulated signal is coupled to a summing circuit 100. Other inputs to summing circuit 100 are generated by trapezoid correction circuit 96 and convergence correction circuit 98. A composite correction signal is coupled to output amplifier U2, for driving the auxiliary vertical deflection yoke Y1.

The repetitive parabola signal developed at the output of operational amplifier U1 can be somewhat advanced in phase relative to generation of the raster, due to signal processing elsewhere in the television circuitry. Under these circumstances, it might be necessary to insert a phase delay, for example after the output of the operational amplifier, to compensate for the phase difference. Instead, resistor R8 adds a DC bias to the ramp signal, which raises the ramp signal level relative to a zero voltage level baseline. This has the effect of shifting the center of the parabola, as though the parabola had been delayed in time. The DC bias does alter the shape of the parabola to a small extent, but not enough to disturb the convergence correction.

According to the invention, switching means are provided to discharge the feedback capacitor C4. Discharging C4 turns the integrator configuration of the operational amplifier into that of a follower amplifier, setting the output to the level at the noninverting input, which is grounded. Accordingly, the parabola is initialized to zero amplitude as of a point in time defined by the retrace pulse rather than reaching its minimum as a function of the integration of the ramp and the time constant constrained discharge of the capacitor. This removes any error which may accumulate due to the fact that the ramp generation is coupled at least indirectly to the switched vertical deflection circuit through the integrated high voltage transformer (IHVT), and may be modulated thereby at the vertical rate.

The switching means for discharging capacitor C4 includes switching transistor Q5, coupled in parallel with capacitor C4 and in series with resistor R18 at its emitter. The base of transistor Q5 is coupled to the retrace pulses from horizontal deflection circuit 106 through a differentiator formed by capacitor C9 and resistor R17. Differentiating the pulses produces a high going pulse at the leading edge and a low going pulse at the trailing edge of the retrace pulse. The low-going pulse is cancelled by diode D2, clamping the base of transistor Q5 relative to ground. The differentiator produces a very narrow pulse, whereby capacitor C4 is quickly discharged coincident with the leading edge of the retrace pulse. Resistor R32 is series coupled in the retrace signal path to capacitor C9, and provides protection against arcing of the kinescope (not shown).

According to the embodiment of FIG. 5, the parabola obtained at the output of operational amplifier U1 is fed back to the current supply transistor Q1 to modulate the otherwise constant current supply and give the ramp at integrating capacitor C2 the modified shape shown in FIG. 5. The parabola is AC coupled via capacitor C6 and series resistor R11 to an inverting amplifier stage including transistor Q4. The base of transistor Q4 is biased by resistors R12 and R13. Resistors R14 and R15 set the gain for transistor Q4. The inverted signal is AC coupled via series resistor R16 and capacitor C8 to the collector of current supply transistor Q1. The added current to Q1 during the times in the cycle when the parabolic output signal at the output of U1 is at is minimum causes the charging rate of capacitor C2 to be greater at the beginning and end of the ramp. The result is a modified parabola shape wherein the slope of the parabola is greater at the lateral sides, which reduces residual gullwing distortion in the raster. This aspect of the circuit is explained in more detail in commonly owned, copending application Ser. No. (RCA 85,835) entitled Pincushion Correction Circuit With Gullwing Compensation, by E. Rodriguez-Cavazos, et al.

Figure 6:
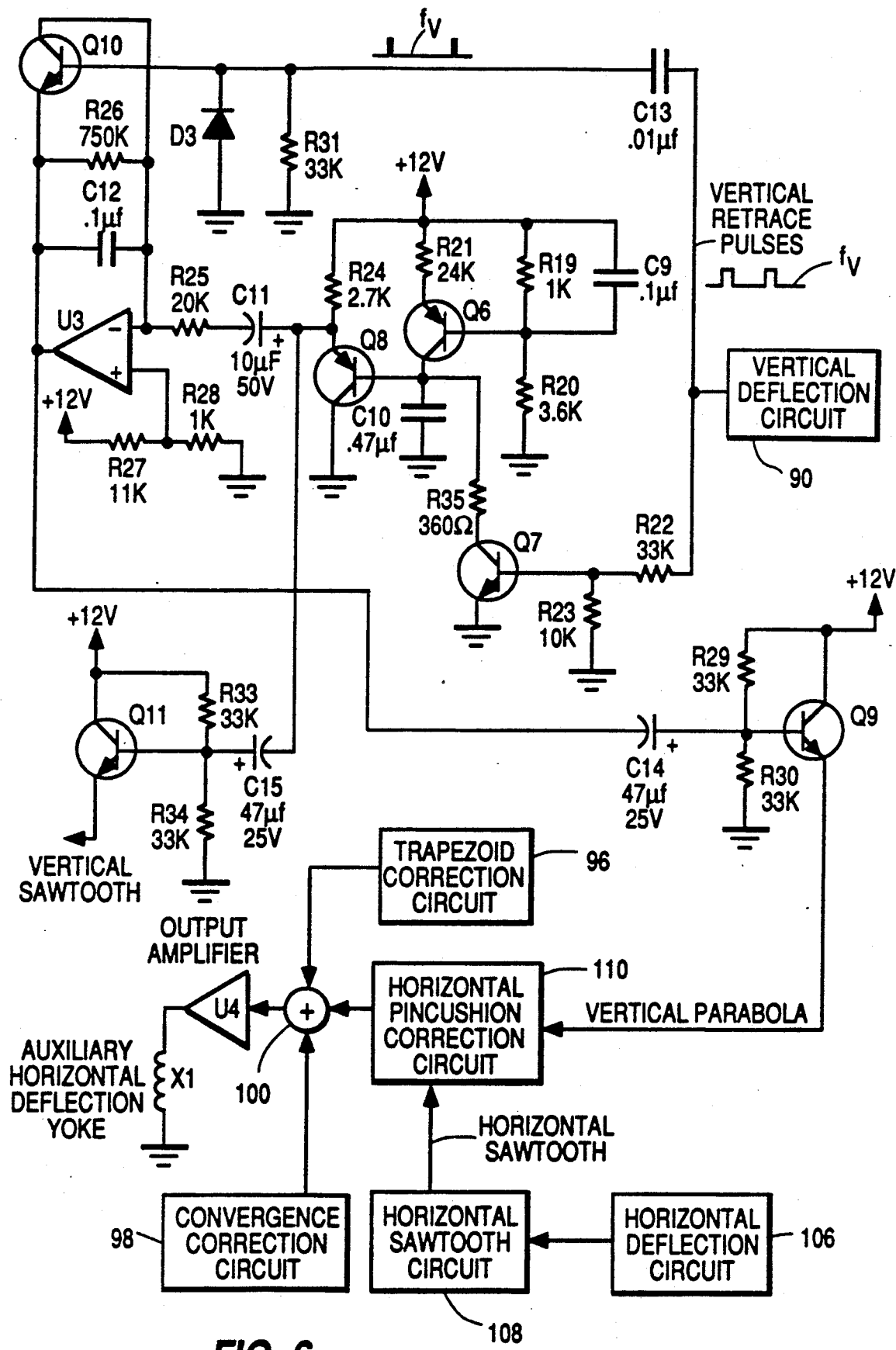
FIG. 6 is a circuit schematic of a parabola generator for developing a correction signal for East-West pincushion correction, according to another aspect of the invention.

The circuit schematic shown in FIG. 6 is arranged for correction of East-West pincushion distortion rather than NorthSouth. Accordingly, a sawtooth is produced at the vertical rate and is integrated to form a parabola which is modulated at the horizontal rate, correcting lateral distortion as shown in FIG. 3. Circuits for correction of both forms of distortion are preferably included in the television apparatus. In FIG. 6, PNP current supply transistor Q6 supplies a constant current to charge integrating capacitor C10. As in the foregoing embodiment, a voltage divider including R19 and R20 sets the level at the base of Q6, which is decoupled relative to the positive supply by capacitor C9. Transistor Q6 maintains a constant current through R21, coupled to the positive supply, thereby producing a ramp at integrating capacitor C10. Capacitor C10 is discharged at the vertical rate by a switching means coupled to vertical retrace triggering means in vertical deflection circuit 90. In the represented embodiment, the switching means includes transistor Q7, coupled to the integrating capacitor C10 through resistor R35. The base of transistor Q7 is coupled to the vertical deflection circuit 90 via series and parallel resistors R22 and R23, respectively, which set the appropriate level.

The ramp at the vertical rate obtained at integrating capacitor C10 is coupled to a follower amplifier comprising PNP transistor Q8, whose emitter is coupled to the positive supply through resistor R24 and whose collector is grounded. Inasmuch as the ramp at C10 in this embodiment is linear, rather than modified as in FIG. 5, the vertical sawtooth signal at the emitter of transistor Q8 can be used in other circuits. For this purpose, the emitter of Q8 is coupled to an NPN transistor Q11 via series capacitor C15. The base of transistor Q11 is biased by resistors R33 and R34.

The emitter of Q8 of the follower amplifier stage is AC coupled through series capacitor C11 and resistor R25 to the inverting input of operational amplifier U3. A feedback path including capacitor C12 couples the operational amplifier inverting input and output, to form an active integrator. Leakage resistor R26 is coupled in parallel to C12, as is switching transistor Q10. Transistor Q10 discharges capacitor C12 at the beginning of a vertical retrace pulse. Inasmuch as the noninverting input to operational amplifier U3 is set at a fixed positive voltage by a voltage divider including resistors R27 and R28, the output of U3 is set to this voltage when transistor Q10 discharges capacitor C12. The vertical retrace pulses are differentiated by capacitor C13 and resistor R31, forming a narrow pulse at the beginning of the vertical retrace pulse. The differentiated output is clamped relative to ground by diode D3. As C10 is periodically charged and reset at the vertical rate, the ramp or sawtooth thereby produced is integrated to form a parabola at this rate at the output of operational amplifier U3.

The parabola at the output of U3 is AC coupled by series capacitor C14 to a further amplifier stage including transistor Q9. The base of transistor Q9 is biased by resistors R29 and R30. The vertical rate parabola is an output at the emitter of transistor Q9. The emitter is coupled to horizontal pincushion correction circuit 106, where the vertical rate parabola is modulated by a horizontal rate sawtooth. The horizontal pincushion correction circuit 110 receives a horizontal sawtooth signal from horizontal sawtooth circuit 108. Horizontal sawtooth circuit 108 is responsive to horizontal deflection circuit 106. The output of horizontal pincushion correction circuit 110 is a summing circuit 102. Other inputs to the summing circuit 102 are generated by the trapezoid correction circuit 96 and the convergence correction circuit 98. The output of summing circuit 102 is coupled to amplifier U4 for driving the auxilliary horizontal deflection yoke X1.

In each of the foregoing embodiments, the feedback capacitor of an active integrator in a parabola generator is positively discharged by switch means at a point in time defined by a timing pulse, for example at the leading edge of a retrace pulse. In the embodiment of FIG. 5, the auxiliary reset function prevents distortion of the horizontal correction parabola by vertical rate phase and timing disturbances, for example those caused by switched mode operation of a vertical deflection system. In the embodiment of FIG. 6, the auxiliary reset function prevents distortion of the vertical correction parabola by vertical rate phase and timing disturbances, for example those caused by switched mode operation of a vertical deflection system, particularly at the time of vertical retrace. However, there is a further advantage in the embodiment of FIG. 6. Normally, vertical retrace triggering is derived from the received video signal. During a channel change, when vertical sync is lost, a free running circuit in the vertical deflection circuit will provide internal vertical synchronizing pulses to prevent the raster from collapsing, although at a lower frequency than the vertical rate. Inasmuch as the vertical ramp is reset by the vertical retrace signal, the vertical ramp charges longer during the transient period following a channel change because the internal vertical period is longer, until a valid synchronizing signal is detected for the new channel. The auxiliary reset function prevents the longer charging of the vertical ramp during channel change from effecting the steady state values of the vertical rate parabolas generated after vertical sync is reestablished, so as to prevent convergence bounce.

Generally, the time constants throughout the correction circuits produce unacceptable performance if the horizontal and vertical rate parabolas deviate from their respective steady state levels. The auxiliary reset function in the integrator, responsive to a timing signal according to aspects of the invention, enables the steady state levels to be more closely maintained.

What is claimed is:

1. A parabola waveform generator for correction of a television raster, comprising:
   a resettable circuit for generating a repetitive ramp signal;
   first resetting means for initializing said ramp circuit at a frequency related to a scanning frequency;
   a resettable integrator for generating a repetitive parabola signal from said repetitive ramp signal; and
   auxiliary resetting means for initializing said integrator to an input condition independent of each preceding repetitive parabola prior to integrating each said repetitive parabola.

2. The waveform generator of claim 1, wherein said scanning frequency is a horizontal scanning frequency and said ramp and parabola signals are initialized after each horizontal scanning interval.

3. The waveform generator of claim 2, wherein said first resetting means and said auxiliary resetting means are responsive to horizontal retrace pulses.

4. The waveform generator of claim 1, wherein said first resetting means is responsive to horizontal retrace pulses and said auxiliary resetting means is responsive to differentiated horizontal retrace pulses.

5. The waveform generator of claim 2, comprising means for modulating said horizontal rate parabola signal at a vertical scanning frequency.

6. The waveform generator of claim 1, wherein said scanning frequency is a vertical scanning frequency and said ramp and said parabola signals are initialized after each vertical scanning interval.

7. The waveform generator of claim 6, wherein said first resetting means and said auxiliary resetting means are responsive to vertical retrace pulses.

8. The waveform generator of claim 1, wherein said first resetting means is responsive to vertical retrace pulses and said auxiliary resetting means is responsive to differentiated vertical retrace pulses.

9. The waveform generator of claim 6, comprising means for modulating said vertical rate parabola signal at a horizontal scanning rate.

10. The waveform generator of claim 1, wherein said integrator comprises an operational amplifier and a feedback capacitor for integrating said repetitive ramp signal.

11. The waveform generator of 10, wherein said auxiliary resetting means comprises a transistor switch for discharging said capacitor.

12. The waveform generator of claim 10, wherein said integrator is coupled to a high voltage transformer operable to power deflection of a beam of said raster, said auxiliary means correcting errors in the raster due to loading of the transformer.

13. The waveform generator of claim 1, wherein said input condition is a zero offset DC voltage bias level for said ramp signal.

14. A pincushion correction circuit for a television raster, comprising:
   means for repetitively producing a ramp signal at a first scanning rate;
   an amplifier having an input coupled to said ramp signal and having an output;
   a capacitor coupled between said input and output of said amplifier to produce a repetitive parabola signal at said output responsive to said ramp signal;
   means for discharging said capacitor in time coincidence with a control signal at said first scanning rate to set said amplifier to an input condition independent of each preceding repetitive parabola; and,
   means for modulating said parabola signal at a second scanning rate for driving a scanning electron beam deflection circuit.

15. The pincushion correction circuit of claim 14, wherein said first scanning rate is a horizontal scanning rate and said second scanning rate is a vertical scanning rate.

16. The pincushion correction circuit of claim 14, wherein said control signal is derived from horizontal retrace pulses.

17. The pincushion correction circuit of claim 14, further comprising a differentiator for producing a narrow pulse substantially coincident with each leading edge of said control signal for initiating said discharge of said capacitor.

18. The pincushion correction circuit of claim 14, wherein said first scanning rate is a vertical scanning rate and said second scanning rate is a horizontal scanning rate.

19. The pincushion correction circuit of claim 14, wherein said control signal is derived from vertical retrace pulses.

20. The pincushion correction circuit of claim 14, wherein said input condition is a zero offset DC voltage bias level for said ramp signal.

21. A deflection system for a television, comprising:
a horizontal deflection circuit, generating horizontal retrace pulses at a horizontal scanning rate;
a switched mode vertical deflection circuit, generating vertical retrace pulses at a vertical scanning rate;
a pincushion distortion correction circuit for correcting a raster produced by said horizontal and vertical deflection circuits, comprising:
means for repetitively producing a ramp signal at one of said scanning rates;
an integrator having a capacitance for producing a repetitive parabola signal responsive to said ramp signal;
means for discharging said capacitance in time coincidence with a control signal at said one scanning rate to set said integrator to an input condition independent of each preceding repetitive parabola; and,
means for modulating said parabola signal at said other of said scanning rates for energizing a deflection coil in one of said deflection systems.

22. The system of claim 21, wherein said ramp signal is produced at said horizontal scanning rate and said parabola signal is modulated at said vertical rate.

23. The system of claim 21, wherein said ramp signal is produced at said vertical scanning rate and said parabola signal is modulated at said horizontal rate.

24. The system of claim 21, wherein said control signal is derived from scanning retrace pulses.

25. The system of claim 21, wherein said control signal is derived from horizontal retrace pulses.

26. The system of claim 21, wherein said control signal is derived from vertical retrace pulses.

27. The system of claim 21, wherein said deflection coil is an auxiliary deflection coil energized by a composite signal for correcting trapezoid distortion, convergence distortion and said pincushion distortion.

28. The system of claim 21, wherein said input condition is a zero offset DC voltage bias level for said ramp signal.

* * * * *